(12) United States Patent
Lee et al.

(10) Patent No.: US 11,215,883 B2
(45) Date of Patent: Jan. 4, 2022

(54) CHIP ON FILM PACKAGE AND DISPLAY APPARATUS HAVING IHE SAME

(71) Applicant: SAMSUNG DISPLAY CO., LTD., Yongin-si (KR)

(72) Inventors: Chong-Guk Lee, Seoul (KR); Joo-Yeon Won, Seoul (KR); Se-Hul Jang, Yongin-si (KR); Su-Mi Moon, Yongin-si (KR); Dong-Wook Lee, Cheonan-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 0 days.

(21) Appl. No.: 16/924,618

(22) Filed: Jul. 9, 2020

(65) Prior Publication Data
US 2020/0341320 A1 Oct. 29, 2020

Related U.S. Application Data

(63) Continuation of application No. 16/042,401, filed on Jul. 23, 2018, now Pat. No. 10,747,074, which is a (Continued)

(30) Foreign Application Priority Data

Sep. 3, 2014 (KR) .......................... 10-2014-0117193

(51) Int. Cl.
*H05K 1/02* (2006.01)
*G02F 1/1345* (2006.01)
(Continued)

(52) U.S. Cl.
CPC ...... *G02F 1/13452* (2013.01); *H01L 23/4985* (2013.01); *H05K 1/028* (2013.01);
(Continued)

(58) Field of Classification Search
CPC ............ G02F 1/13452; H01L 23/4985; H01L 27/124; H01L 24/16; H01L 24/48;
(Continued)

(56) References Cited

U.S. PATENT DOCUMENTS 7,599,193 B2 10/2009 Park et al.
9,664,964 B2 5/2017 Lee et al.
(Continued)

FOREIGN PATENT DOCUMENTS

JP 2005-167238 6/2005
KR 1020070019358 2/2007
(Continued)

OTHER PUBLICATIONS

Office Action dated Sep. 4, 2020 in Korean Patent Application 10-2014-0117193 (in Korean), 6 pages.
(Continued)

*Primary Examiner* — Timor Karimy
(74) *Attorney, Agent, or Firm* — F. Chau & Associates, LLC

(57) ABSTRACT

A chip on film package includes a base substrate, an input line, an integrated circuit (IC) chip and an output line. The input line is disposed on the base substrate. The IC chip is electrically connected to the input line. The output line includes a main output and a sub output line. The main output line is electrically connected to the IC chip and extends in a first direction from the IC chip. The sub output line is electrically connected to the IC chip. The sub output line includes at least six bending parts, and is extended in the first direction.

25 Claims, 4 Drawing Sheets

Related U.S. Application Data continuation of application No. 15/604,877, filed on May 25, 2017, now Pat. No. 10,031,385, which is a continuation of application No. 14/678,406, filed on Apr. 3, 2015, now Pat. No. 9,664,964.

(51) Int. Cl.
  *H01L 23/498* (2006.01)
  *H01L 27/12* (2006.01)
  *H01L 23/00* (2006.01)
  *H05K 1/18* (2006.01)

(52) U.S. Cl.
  CPC .............. *H01L 24/16* (2013.01); *H01L 24/48* (2013.01); *H01L 27/124* (2013.01); *H01L 2224/16227* (2013.01); *H01L 2224/48227* (2013.01); *H01L 2224/81191* (2013.01); *H01L 2924/00014* (2013.01); *H01L 2924/15159* (2013.01); *H05K 1/189* (2013.01); *H05K 2201/09227* (2013.01); *H05K 2201/09272* (2013.01); *H05K 2201/09281* (2013.01); *H05K 2201/10674* (2013.01)

(58) Field of Classification Search
  CPC . H01L 2224/16227; H01L 2224/48227; H01L 2224/81191; H01L 2924/00014; H01L 2924/15159; H05K 1/028; H05K 1/189; H05K 2201/09227; H05K 2201/09272; H05K 2201/09281; H05K 2201/10674
  See application file for complete search history.

(56) References Cited

U.S. PATENT DOCUMENTS

| | | |
|---|---|---|
| 10,031,385 B2 | 7/2018 | Lee et al. |
| 2008/0024714 A1 | 1/2008 | Park |
| 2016/0062172 A1 | 3/2016 | Lee et al. |
| 2017/0261799 A1 | 9/2017 | Lee et al. |
| 2018/0329253 A1 | 11/2018 | Lee et al. |

FOREIGN PATENT DOCUMENTS

| | | |
|---|---|---|
| KR | 10-2008-0020858 | 3/2008 |
| KR | 1020080077588 | 8/2008 |
| KR | 1020110067819 | 6/2011 |
| KR | 1020120088332 | 8/2012 |
| KR | 10-2007-0081708 | 8/2017 |

OTHER PUBLICATIONS

Notice of Allowance dated Feb. 24, 2021 from the Korean Intellectual Property Office (KIPO) for corresponding Korean Patent Application No. 10-2014-0117193 (5 pages, in Korean).

CHIP ON FILM PACKAGE AND DISPLAY APPARATUS HAVING THE SAME

CROSS-REFERENCE TO RELATED APPLICATION

This U.S. non-provisional application is a continuation of U.S. application Ser. No. 16/042,401, filed on Jul. 23, 2018, which is a continuation of U.S. application Ser. No. 15/604,877, filed on May 25, 2017, and issued as U.S. Pat. No. 10,031,385 on Jul. 24, 2018, which is a continuation of U.S. application Ser. No. 14/678,406, filed on Apr. 3, 2015, and issued as U.S. Pat. No. 9,664,964 on May 30, 2017, which claims priority under 35 U.S.C. § 119 to Korean Patent Application No. 10-2014-0117193, filed on Sep. 3, 2014, the disclosures of which are incorporated by reference herein in their entireties.

TECHNICAL FIELD

Exemplary embodiments of the present inventive concept relate to a display apparatus, and more particularly, to a chip on film package and a display apparatus having the chip on film package.

DISCUSSION OF RELATED ART

A liquid crystal display apparatus may include a flat panel display FPD. Examples of FDPs may include, but are not limited to, a liquid crystal display ("LCD"), a plasma display panel ("PDP") and an organic light emitting display ("OLED").

The liquid crystal display apparatus may apply voltages to liquid crystal molecules to adjust arrangements of the molecules thereby changing optical characteristics of a liquid crystal cell such as birefringence, optical activity, dichroism and light scattering to display an image.

The liquid crystal display apparatus may include a liquid crystal display panel, a printed circuit board and a backlight unit. The liquid crystal display panel may display an image. The printed circuit board may generate a driving signal to drive the liquid crystal display panel. The backlight unit may be disposed on a lower surface of the liquid crystal display panel and may provide light to the liquid crystal display panel.

The liquid crystal display panel may be electrically connected to the printed circuit board. The liquid crystal display panel may be electrically connected to the printed circuit board through a chip on film (COF) package.

The chip on film package may include a circuit wiring formed on a flexible substrate. The chip on film package may be curved, and the printed circuit board may be disposed on a lower surface of the liquid crystal display panel.

SUMMARY

Exemplary embodiments of the present inventive concept provide chip on film package which prevents a circuit wiring from being cut.

Exemplary embodiments of the present inventive concept provide a display apparatus having the chip on film package.

In accordance with an exemplary embodiment of the present inventive concept, a chip on film package includes a base substrate, an input line, an integrated circuit (IC) chip and an output line. The input line is disposed on the base substrate. The IC chip is electrically connected to the input line. The output line includes a main output and a sub output line. The main output line is electrically connected to the IC chip and extends in a first direction from the IC chip. The sub output line is electrically connected to the IC chip. The sub output line includes at least six bending parts and extends in the first direction.

In an exemplary embodiment of the present inventive concept, the sub output line may have a uniform width.

In an exemplary embodiment of the present inventive concept, the sub output line may have a width of about 11 um to about 13 um.

In an exemplary embodiment of the present inventive concept, the base substrate may be a flexible film.

In an exemplary embodiment of the present inventive concept, the chip on film package may include electrode bumps disposed on lower surfaces of each edge of the IC chip. The IC chip may be connected to the input line and the output line through the electrode bumps.

In an exemplary embodiment of the present inventive concept, the chip on film package may include an encapsulant part surrounding the IC chip and fixing the IC chip on the base substrate. The encapsulant part may encapsulate the electrode bump and portions of the input line and the output line.

In an exemplary embodiment of the present inventive concept, the chip on film package may include a protecting layer covering portions of the input line and the output line.

In an exemplary embodiment of the present inventive concept, the chip on film package may include a by-pass line bypassing the input line, the output line and the IC chip.

In accordance with an exemplary embodiment of the present inventive concept, a display apparatus includes a display panel, a printed circuit board and a chip on film package. The printed circuit board is disposed on a lower surface of the display panel. The chip on film package connects the display panel and the printed circuit board. The chip on film package includes a base substrate, an input line, an integrated circuit (IC) chip and an output line. The input line is disposed on the base substrate. The IC chip is electrically connected to the input line. The output line includes a main output and a sub output line. The main output line is electrically connected to the IC chip and extends in a first direction from the IC chip. The sub output line is electrically connected to the IC chip. The sub output line includes at least six bending parts and extends in the first direction.

In an exemplary embodiment of the present inventive concept, the sub output line may have a uniform width.

In an exemplary embodiment of the present inventive concept, the sub output line may have a width of about 11 um to about 13 um.

In an exemplary embodiment of the present inventive concept, the base substrate may be a flexible film.

In an exemplary embodiment of the present inventive concept, the display apparatus may include electrode bumps disposed on lower surfaces of each edge of the IC chip. The IC chip may be connected to the input line and the output line through the electrode bumps.

In an exemplary embodiment of the present inventive concept, the display apparatus may include an encapsulant part surrounding the IC chip and fixing the IC chip on the base substrate. The encapsulant part may encapsulate the electrode bump and portions of the input line and the output line.

In an exemplary embodiment of the present inventive concept, the display apparatus may include a protecting layer covering portions of the input line and the output line.

In an exemplary embodiment of the present inventive concept, the display apparatus may include a by-pass line bypassing the input line, the output line and the IC chip.

In an exemplary embodiment of the present inventive concept, the display apparatus may include a receiving container. The display panel and the printed circuit board may be disposed in the receiving container.

In accordance with exemplary embodiments of the present inventive concept, the chip on film package may include a plurality of bending parts, and cutting of the circuit wiring by stress from a curve of the chip on film package may be reduced or prevented.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Hereinafter, exemplary embodiments of the present inventive concept will be described in more detail with reference to the accompanying drawings.

Figure 1:
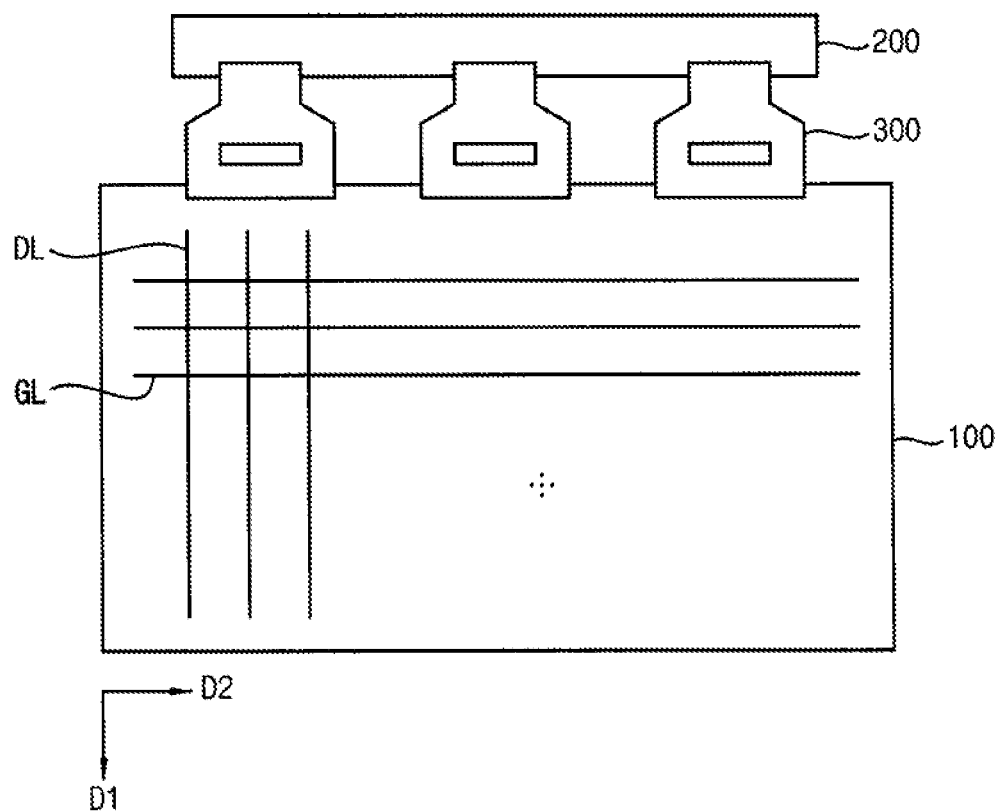
FIG. 1 is a plan view illustrating a display apparatus in accordance with an exemplary embodiment of the present inventive concept.
Figure 2:
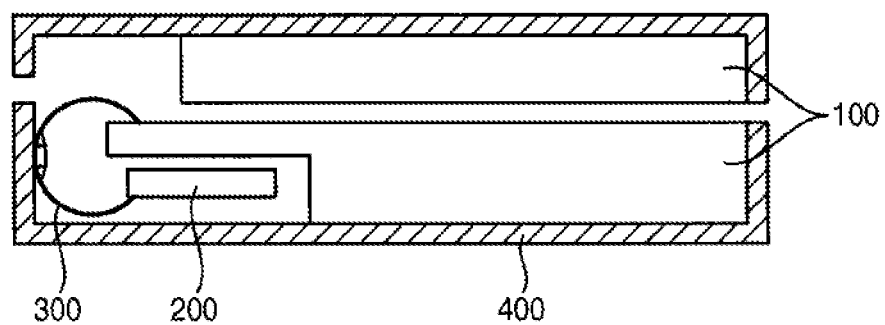
FIG. 2 is a cross-sectional view illustrating a display panel in accordance with an exemplary embodiment of the present inventive concept.
Figure 3:
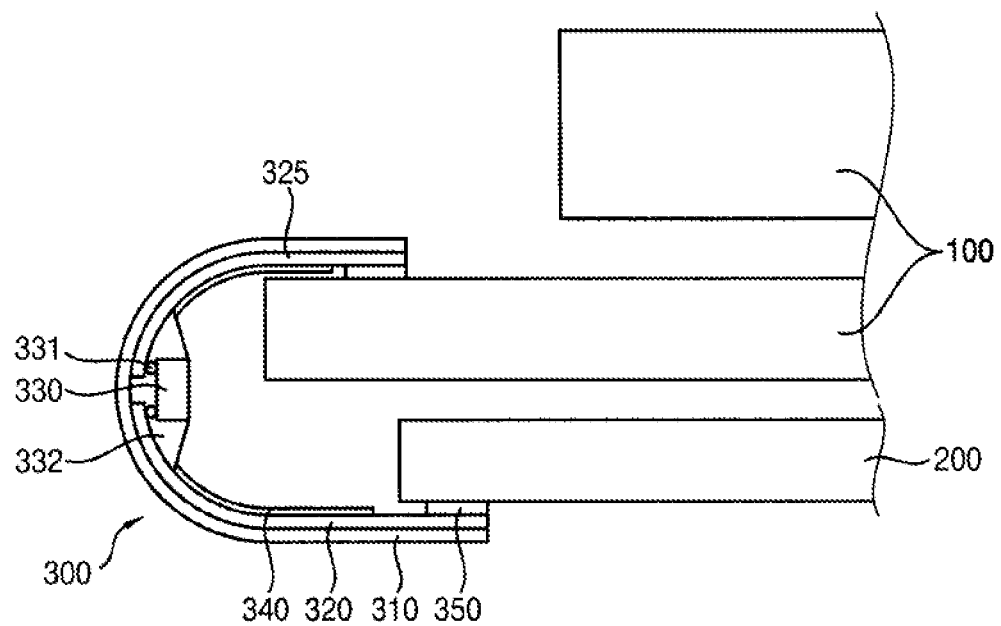
FIG. 3 is an enlarged cross-sectional view of FIG. 2.
Figure 4:
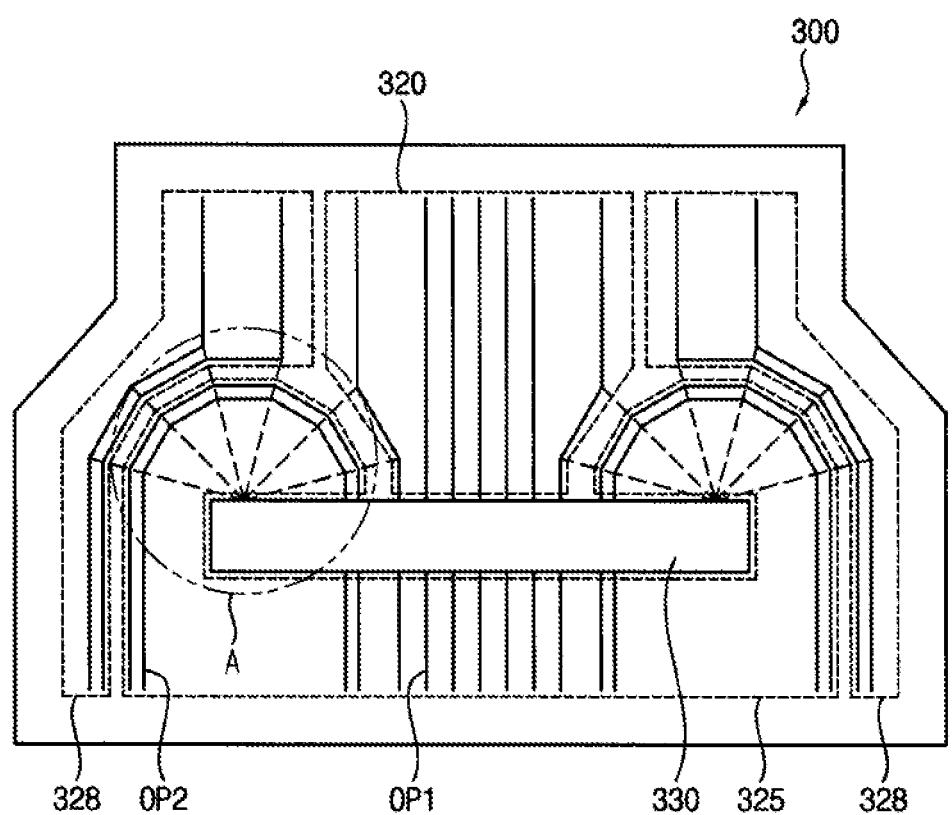
FIG. 4 is a plan view illustrating a chip on film package in accordance with an exemplary embodiment of the present inventive concept.
Figure 5:
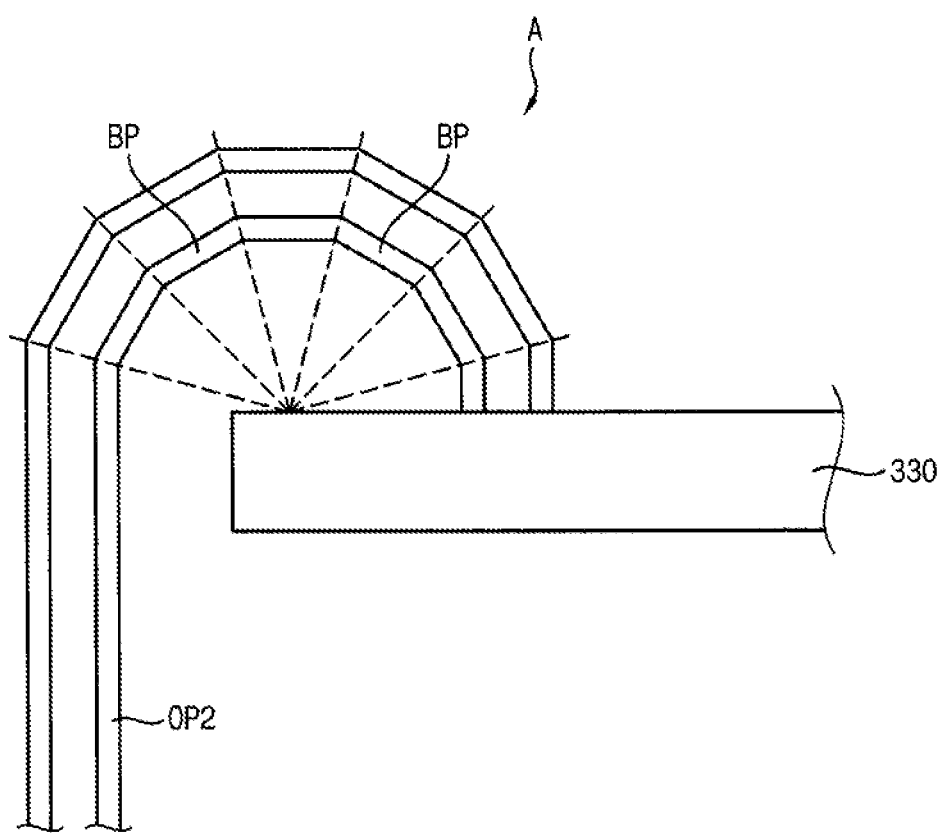
FIG. 5 is an enlarged plan view illustrating an area "A" of FIG. 4.

FIG. 1 is a plan view illustrating a display apparatus in accordance with an exemplary embodiment of the present inventive concept. FIG. 2 is a cross-sectional view illustrating a display panel in accordance with an exemplary embodiment of the present inventive concept. FIG. 3 is an enlarged cross-sectional view of FIG. 2. FIG. 4 is a plan view illustrating a chip on film package in accordance with an exemplary embodiment of the present inventive concept. And, FIG. 5 is an enlarged plan view illustrating an area "A" of FIG. 4.

Referring to FIGS. 1 and 2, a display apparatus in accordance with an exemplary embodiment of the present inventive concept, may include a display panel 100, a printed circuit board 200, a chip on film package 300 and a receiving container 400.

The display panel 100 may display an image.

The display panel 100 may include a plurality of substrates. The substrates may include a transparent insulating substrate. Examples of the transparent insulating substrate may include, but are not limited to, a glass substrate or a plastic substrate.

The display panel 100 may include a plurality of gate lines GL, a plurality of data lines DL and a plurality of pixels.

The gate lines GL may extend in a first direction D1. The data lines DL may extend in a second direction D2 substantially perpendicular to the first direction D1. The gate lines GL may extend in the second direction D2 and the data lines DL may extend in the first direction D1.

The pixels may be arranged in a matrix shape. The pixels may be disposed in areas defined by the gate lines GL and the data lines DL. Each pixel may be connected to a corresponding gate line GL and a corresponding data line DL adjacent to the pixel.

Each pixel may have a rectangular shape extending in the second direction D2, a V-shape, or a Z-shape.

Each pixel may include a switching element. For example, the switching element may be a thin film transistor TFT.

The switching element may be connected to the gate line GL and the data line DL adjacent to the switching element. The switching element may be disposed at a crossing area of the gate line GL and the data line DL.

A liquid crystal layer may be disposed between the substrates. For example, the liquid crystal layer may include liquid crystal molecules. An alignment of the liquid crystal molecules in the liquid crystal layer may be controlled by an electric field. Light transmittance of the pixel may be controlled by different arrangements of the liquid crystal molecules I the liquid crystal layer by applying the electric field.

One or more color filters may be disposed on the substrate. The color of light passing through the color filer may be changed by the color filter and the light may be transmitted to the liquid crystal layer. The color filters may include a red color filter, a green color filter or a blue color filter, for example. Each of the color filters may correspond to one of the pixel areas. The color filters, which may be adjacent to each other, may have different colors from each other.

A black matrix may be disposed on the substrate. For example, the black matrix may be disposed on an area corresponding to the gate line GL, the data line DL and the switching element. The black matrix may include a black material, which may block light.

The liquid crystal display panel may include a color filter on array ("COA") structure. In the COA structure, the color filter may be disposed on a lower surface of a liquid crystal layer. The liquid crystal display panel may include a black matrix on array ("BOA") structure. In the BOA structure, the black matrix may be disposed on the lower surface of a liquid crystal layer.

A pixel electrode and a common electrode may be disposed on the substrates. A grayscale voltage may be applied to the pixel electrode and the common electrode, thus forming an electric field. For example, the pixel electrode and the common electrode may include a transparent conductive material, such as indium tin oxide (ITO), indium zinc oxide (IZO) and/or aluminum zinc oxide (AZO).

The pixel electrode and the common electrode may be disposed on a same substrate. The pixel electrode and the common electrode may be formed on different substrates.

Referring to FIG. 2, the printed circuit board 200 may be disposed on the lower surface of the display panel 100.

The printed circuit board 200 may include a timing controller, a power source, and/or a gamma voltage generator. The timing controller may generate a control signal controlling the gate lines GL and the data lines DL from a raw signal input by an outer apparatus such as a computer. The control signal generated from the timing controller may be transmitted to the display panel 100 through the gate line GL and the data line DL.

The printed circuit board 200 may be disposed adjacent to the display panel 100.

The display panel 100 and the printed circuit board 200 may be connected with each other through the chip on film package 300.

A plurality of chip on film packages 300 may connect the display panel 100 and the printed circuit board 200. For example, the number of the chip on film packages 300 may be increased according to a size of the display panel 100.

The chip on film package 300 may be curved to connect the display panel 100 and the printed circuit board 200.

The chip on film package 300 will be described in more detail below with reference to FIGS. 3 to 5.

The display panel 100 and the printed circuit board 200 may be disposed in the receiving container 400.

Although not illustrated in FIGS. 1 and 2, a backlight unit may emit light to the display panel 100. The backlight unit may be disposed in the receiving container 400. The backlight unit may include a light source. The backlight unit may be disposed on a lower surface of the receiving container 400, and may emit light to the display panel 100.

The chip on film package 300 may be disposed in the receiving container 400.

Referring to FIG. 3, the chip on film package 300 may include a base substrate 310, an input line 320, an output line 325 and an IC chip 330.

The base substrate 310 may be a flexible film including a flexible material.

For example, the base substrate 310 may include polyimide, acrylic, polyether nitrile, polyether sulfone, polyethylene terephthalate, polyethylene naphthalate, or polyvinyl chloride.

The IC chip 330 may be disposed on a center of the base substrate 310. While not illustrated in the figures, a plurality of sprocket holes may be disposed along edges of the base substrate 310. The sprocket holes may be aligned along a direction substantially perpendicular to the IC chip 330.

A circuit wiring may be disposed on the base substrate 310. For example, the circuit wiring may include the input line 320 and the output line 325.

A thin film may be formed on the base substrate 310 and then patterned to form the input line 320 and the output line 325.

The thin film may be coated on the base substrate 310. A photoresist material may be coated on the thin film, and exposed to light using a mask. An exposed photoresist material may be developed, thus forming a photoresist pattern. A portion of the thin film may be removed using the photoresist pattern as a mask, thus forming a thin film pattern. The photoresist pattern may be removed, thus forming a circuit pattern.

For example, the input line 320 and the output line 325 may include copper (Cu), nickel (Ni), gold (Au) or an alloy thereof.

The IC chip 330 may be electrically connected to the input line 320 and the output line 325.

Electrode bumps 331 may be disposed on lower surfaces of each edge of the IC chip 330.

The IC chip 330 may be flip-chip bonded to the base substrate 310 through the electrode bumps 331. The IC chip 330 may be electrically connected to the input line 320 and the output line 325 through the electrode bumps 331.

The IC chip 330 may be electrically connected to the input line 320 and the output line 325 through a wire.

An encapsulant part 332 may be disposed on a lower surface and a side surface of the IC chip 330. The encapsulant part 332 may surround the IC chip 330. The encapsulant part 332 may surround the IC chip 330 to fix the IC chip 330 on the base substrate 310.

The encapsulant part 332 may encapsulate the electrode bump 331 and a portion of the input line 320 and the output line 325.

The encapsulant part 332 may be formed by an under-fill process.

The encapsulant part 332 may include a material having a relatively high thermal conductivity to release heat generated from the IC chip 330. For example, the encapsulant part 332 may include epoxy resin or silicon resin.

A difference in a CTE (Coefficient of Thermal Expansion) may exist between the IC chip 330 and the base substrate 310. The encapsulant part 332 may reduce or eliminate a defect resulting from the difference in the CTE between the IC chip 330 and the base substrate 310.

A protecting layer 340 may be disposed on the input line 320 and the output line 325. The protecting layer 340 may cover a portion of the input line 320 and the output line 325, and may insulate portions of the input line 320 and the output line 325.

The protecting layer 340 may expose a portion of the input line 320 and the output line 325. The protecting layer 340 may be a solder resist.

A conductive layer 350 may be disposed on edges of the input line 320 and the output line 325. The display panel may be electrically connected to the printed circuit board 200 through the conductive layer 350.

The conductive layer 350 may be an anisotropic conductive film (ACF).

The input line 320 may be connected to the printed circuit board 200 through the ACF. The output line 325 may be connected to the printed circuit board 200 through the ACF.

The chip on film package 300 may be relatively flexible. The chip on film package 300 may be bent or curved. The printed circuit board 200 may be disposed at a first end of the chip on film package 300 and the display panel 100 may be disposed at a second end of the chip on film package 300. The printed circuit board 200 may be disposed under the display panel 100.

Referring to FIGS. 4 and 5, the circuit wiring may be disposed on the base substrate 310. The circuit wiring may include the input line 320, the output line 325 and a by-pass line 328.

The input line 320 may input a control signal transmitted from the printed circuit board 200 to the IC chip 330. For example, the control signal may be a data signal.

The input line 320 may be electrically connected to a first edge of the IC chip 330. The IC chip 330 may receive the data signal through the input line 320.

The input line 320 may extend in the first direction D1 from the printed circuit board 200 to the IC chip 330.

The output line 325 may output a signal transmitted from the IC chip 330 to the display panel 100. The output line 325 may be connected to the data line DL.

The IC chip for driving the liquid crystal display apparatus may include an input pad connected to the input line 320 and an output pad connected to the output line 325, and the number of output pads may be greater than the number of input pads.

The output line 325 may include a main output line OP1 and a sub output line OP2.

The main output line OP1 may be electrically connected to the IC chip 330 at a second edge of the IC chip 330.

The main output line OP1 may extend in the first direction D1 from the IC chip 330 to the display panel 100.

An edge of the sub output line OP2 may be electrically connected to the first edge of the IC chip 330. Another edge of the sub output line OP2 may be connected to the data line DL.

The sub output line OP2 may extend in an opposite direction from the first direction D1 from the first edge of the IC chip 330.

The sub output line OP2 may include a plurality of bending parts BP so that the sub output line OP2 may be curved and may extend toward the first direction D1

The sub output line OP2 may extend in the opposite direction from the first direction D1 from the first edge of the IC chip 330 toward the printed circuit board 200. The sub output line OP2 may include the bending parts BP so that an extending direction of the sub output line OP2 may be changed in the first direction D1.

A difference between a first direction extended from a first edge of the sub output line OP2 and a second direction extended toward a second edge of the sub output line OP2 may be 180°.

Therefore, the sub output line OP2 may bypass the IC chip 330, and may extend toward the display panel 100.

For example, at least 6 bending parts BP may be included in the sub output line OP2. Therefore, stress from a curved portion of the chip on film package 300 may be reduced or eliminated, so that a cut in the circuit wiring may be prevented. When less than 6 bending parts BP are included, the circuit wiring may be relatively weak because stress from the curve of the chip on film package 300 may cause a cut in the circuit wiring. Thus, for example, the sub output line OP2 may include at least 6 bending parts BP.

The sub output line OP2 may have a uniform width.

For example, the sub output line OP2 may have a width of about 11 um to about 13 um. When the width of the sub output line OP2 is less than 11 um, the circuit wiring may be more easily cut by stress applied when the chip on film package 300 is curved or bent. When the width of the sub output line OP2 is more than 13 um, stress applied when the chip on film package 300 is curved or bent may converge at a bending part BP of the circuit wiring, and a cut may be more likely to occur in the circuit wiring.

The by-pass line 328 may bypass the input line 320, the output line 325 and the IC chip 330.

The by-pass line 328 may input the control signal transmitted from the printed circuit board 200 to a gate driving chip (not illustrated). For example, the control signal input to the gate driving chip may be a gate signal.

The by-pass line 328 may be connected to the gate line GL through the gate driving chip.

While the inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A device comprising:
a base substrate;
an integrated circuit (IC) chip disposed on the base substrate;
a first line extending from a first side of the base substrate to a first side of the IC chip;
a second line starting from the first side of the IC chip and having a turning portion to extend toward a second side of the base substrate opposite to the first side of the base substrate, the turning portion being disposed between the first side of the IC chip and the first side of the base substrate, in a plan view;
a third line extending from the first side of the base substrate and toward the second side of the base substrate and bypassing the IC chip;
a first conductive layer adjacent to the first side and electrically connected to the first line; and
a second conductive layer adjacent to the second side and electrically connected to the second line,
wherein the first conductive layer and the second conductive layer are disposed on a same surface of the base substrate,
wherein the turning portion includes a plurality of extending portions extending in different directions from each other such that an included angle formed by adjacent extending portions of the turning portion is an obtuse angle,
wherein the third line includes a turning portion extending along a portion of the turning portion of the second line.

2. The device of claim 1, wherein the IC chip is disposed on the same surface of the base substrate, on which the first and second conductive layers are disposed.

3. The device of claim 1, wherein the second line includes a first extending portion extending in a first direction, and a second extending portion extending in a diagonal direction with respect to the first extending portion.

4. The device of claim 1, further comprising:
a fourth line extending from a second side of the IC chip, which is opposite to the first side of the IC chip, toward the second side of the base substrate.

5. The device of claim 1, wherein the first line is configured to transfer a control signal from a controller to the IC chip.

6. The device of claim 5, wherein the second line is configured to transfer a data signal generated by the IC chip to a data line of a display panel.

7. The device of claim 1, wherein the turning portion includes at least six extending portions.

8. The device of claim 1, wherein a difference between an extending direction of a first part of the turning portion and an extending direction of a second part of the turning portion is about 180°.

9. The device of claim 1, wherein the third line is configured to transfer a gate driving signal from a controller to a gate driver of a display panel.

10. The device of claim 1, wherein the second line has a width of about 11 um to about 13 um.

11. The device of claim 1, further comprising:
an encapsulant part surrounding the IC chip and fixing the IC chip on the base substrate.

12. The device of claim 1, wherein the first line includes a first portion, a second portion extending along a same direction as the first portion, and a turning portion extending along a portion of the turning portion of the second line and disposed between the first portion and the second portion of the first line.

13. The device of claim 1, wherein the third line further includes a first portion and a second portion extending along a same direction as the first portion,
wherein the first portion and the second portion extend from both ends of the turning portion, respectively, in the third line,
wherein the turning portion of the third line includes at least two diagonal portions extending in different directions.

14. A display apparatus comprising:
a display panel;
a controller part disposed under the display panel; and
a driver part connected to the display panel and the controller part, wherein the driver part comprises:
a base substrate;

an integrated circuit (IC) chip disposed on the base substrate;

a first line extending from a first side of the base substrate to a first side of the IC chip; and a second line starting from the first side of the IC chip and having a turning portion to extend toward a second side of the base substrate opposite to the first side of the base substrate, the turning portion being disposed between the first side of the IC chip and the first side of the base substrate, in a plan view;

wherein the turning portion includes a plurality of extending portions extending in different directions from each other such that an included angle formed by adjacent extending portions of the turning portion is an obtuse angle, wherein the driver part has a bending shape, and the IC chip is disposed to face a side surface of the display panel.

15. The display apparatus of claim 14, wherein the driver part further includes:

a first conductive layer adjacent to the first side and electrically connected to the first line; and a second conductive layer adjacent to the second side and electrically connected to the second line.

16. The display apparatus of claim 15, wherein the first conductive layer and the second conductive layer are disposed on a same surface on which the IC chip is disposed.

17. The display apparatus of claim 15, wherein the first conductive layer is bonded to a rear surface of the controller part.

18. The display apparatus of claim 15, wherein the second conductive layer is bonded on an upper surface of a substrate of the display panel.

19. The display apparatus of claim 14, wherein the IC chip is configured to generate a driving signal transferred to the display panel through the second line.

20. The display apparatus of claim 14, wherein the driver par further includes a third line extending from the first side of the base substrate and toward the second side of the base substrate and bypassing the IC chip, wherein the third line includes a turning portion extending along a portion of the turning portion of the second line.

21. The display apparatus of claim 20, wherein the third line is configured to transfer a gate driving signal from the controller part to the display panel.

22. A display apparatus comprising:

a display panel;

a controller part disposed under the display panel; and a driver part connected to the display panel and the controller part, wherein the driver part comprises:

a base substrate;

an integrated circuit (IC) chip disposed on the base substrate;

a first line extending from a first side of the base substrate to a first side of the IC chip;

a second line starting from the first side of the IC chip and having a turning portion to extend toward a second side of the base substrate opposite to the first side of the base substrate, the turning portion being disposed between the first side of the IC chip and the first side of the base substrate, in a plan view;

a third line extending from the first side of the base substrate and toward the second side of the base substrate and bypassing the IC chip;

a first conductive layer adjacent to the first side and electrically connected to the first line; and a second conductive layer adjacent to the second side and electrically connected to the second line, wherein the first conductive layer and the second conductive layer are disposed on a same surface of the base substrate, wherein the turning portion includes a plurality of extending portions extending in different directions from each other such that an included angle formed by adjacent extending portions of the turning portion is an obtuse angle, wherein the third line includes a turning portion extending along a portion of the turning portion of the second line.

23. The display apparatus of claim 22, wherein the IC chip is disposed on the same surface of the base substrate, on which the first and second conductive layers are disposed.

24. The display apparatus of claim 22, wherein the first conductive layer is bonded to a rear surface of the controller part.

25. The display apparatus of claim 24, wherein the second conductive layer is bonded on an upper surface of a substrate of the display panel.

* * * * *